(12) United States Patent
Khieu

(10) Patent No.: US 6,421,290 B2
(45) Date of Patent: Jul. 16, 2002

(54) OUTPUT CIRCUIT FOR ALTERNATING MULTIPLE BIT LINE PER COLUMN MEMORY ARCHITECTURE

(75) Inventor: Cong Khieu, San Jose, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/841,172

(22) Filed: Apr. 23, 2001

Related U.S. Application Data

(63) Continuation of application No. 09/289,460, filed on Apr. 9, 1999, now Pat. No. 6,222,777.

(51) Int. Cl.$^7$ ................................................ G11C 7/00
(52) U.S. Cl. ................... 365/205; 365/189.02; 365/203
(58) Field of Search ........................... 365/205, 189.02, 365/203, 189.01

(56) References Cited

U.S. PATENT DOCUMENTS

| | | | |
|---|---|---|---|
| 5,521,875 A | * | 5/1996 | Callahan ..................... 365/207 |
| 5,808,933 A | * | 9/1998 | Roos, Jr. et al. ............. 365/156 |
| 5,828,610 A | * | 10/1998 | Rogers et al. ............... 365/203 |
| 5,850,359 A | * | 12/1998 | Liu ............................. 365/156 |

* cited by examiner

Primary Examiner—Hoai V. Ho
(74) Attorney, Agent, or Firm—Pennie & Edmonds LLP

(57) ABSTRACT

A memory has memory cells arranged in rows and columns. The memory cells of each row are coupled to a word line that is separate from word lines connecting to the memory cells of other rows. Each column has mutually exclusive subsets of memory cells. The memory cells are coupled to bit lines. Each bit line is coupled to a selected mutually exclusive subset of memory cells. The memory cells of a selected row output a cell voltage on the coupled bit lines when the coupled word line is asserted. A multiplexor receives the cell voltages on the bit lines. The multiplexor is responsive to column select signals to select one of the columns as a selected column, and outputs a multiplexor voltage corresponding to the cell voltage of the memory cell of the selected row and the selected column.

10 Claims, 11 Drawing Sheets

US 6,421,290 B2

OUTPUT CIRCUIT FOR ALTERNATING MULTIPLE BIT LINE PER COLUMN MEMORY ARCHITECTURE

This application is a continuation of application Ser. No. 09/289,460, filed Apr. 9, 1999, now U.S. Pat. No. 6,222,777.

BRIEF DESCRIPTION OF THE INVENTION

This invention relates generally to memories. More particularly, this invention relates to a new high speed memory circuit.

BACKGROUND OF THE INVENTION

As microprocessors operate at faster speeds, demand for faster memories continues to increase. In one memory application, a microprocessor uses a memory as a look-up table that stores a normalized set of coefficients representing a mathematical expression such as a quadratic equation or square root. These types of memories are typically read only memories (ROMs) and are referred to as coefficient ROMs.

Other memory applications use random access memories (RAMs) to temporarily store instructions and data. For example, the data can include a status array. Since RAMs perform reads and writes in the same cycle the timing and design constraints are greater.

In FIG. 1, a typical memory 20 has an array of memory cells 22 that store information, such as instructions and data, as digital information having a logical one or a logical zero value. A logical one corresponds to a high voltage level, while a logical zero corresponds to a low voltage level. To access information stored in the array of memory cells 22, address signals, such as word line signals, are applied to the word lines 30.

In response to the address signals on the word lines, the array of memory cells 22 outputs the stored information for a row of cells on a bus 36 to a column multiplexor 38. In response to column select signals on a set 40 of column select lines 42–44, the column multiplexor 38 outputs a voltage corresponding to a selected column on bus 46. Typically, the voltage output by the column multiplexor 38 is very low and needs to be amplified for further processing. A sense amplifier 48 receives the signal on bus 46 and amplifies the signal to a predetermined level. In response to a sense amplifier enable signal, the sense amplifier outputs the amplified signals on yet another bus 50.

FIG. 1 was described with respect to a single selected bit. To output a set of bits, such as a byte or a word, memories typically have a large memory array coupled to multiple column multiplexors. Each column multiplexor responds to the same set of column select lines and is associated with a separate sense amplifier.

FIG. 2 illustrates the memory of FIG. 1 in more detail. The array 22 of memory cells (cell) has m rows 52, 54, 56, and n columns, 62, 64, 66. Each cell is connected to a bit line and a word line. Word line 0 (WL0) 32, word line 1 (WL1) 33 and word line m–1 (WLm–1) 34 connect to the memory cells of rows 52, 54 and 56, respectively.

The memory cells in the array 22 output a differential signal. Therefore each bit line is associated with two traces or lines—a primary line 72, 74, 76 which carries one side of the differential signal and a complementary line 82, 84, 86 which carries the complement or other side of the differential signal. For example, Bit line 0 (BL0) 72, Bit line 1 (BL1) 74 and Bit line n–1 (BLn–1) 76 and their complements $\overline{BL0}$ 82, $\overline{BL1}$ 84 and $\overline{BLn-1}$ 86, connect to the memory cells of columns 62, 64, and 66, respectively.

All cells in a column connect to the same bit line, and all cells in a row connect to the same word line. For example, all cells in column 62 connect to lines 72 and 82; and, all cells in row 52 connect to word line 32. When the word line is enabled, the voltage stored in that cell is output on the respective bit line to the column multiplexor 38.

In the column multiplexor 38, passgate blocks 92, 94 and 96 connect to columns 62, 64 and 66, respectively. In each passgate block 92, 94 and 96, PMOS transistors 102, 103, 104, 105, 106 and 107, are connected in series with each bit line, BL0 72, $\overline{BL0}$ 82, BL1 74, $\overline{BL1}$ 84, BLn–1 76 and $\overline{BLn-1}$ 86, respectively. A column select signal, col 0, col 1 and col n, is applied to the gates of the PMOS transistors of each passgate block 92, 94 and 96, respectively, which causes each passgate block 92, 94 and 96 to output a differential signal. The differential outputs of the passgate blocks 92, 94 and 96, are connected and supplied to the sense amplifier 48. Since only one column select signal, col 0, col 1 and col n–1, is active at a time to select a column 62, 64, 66, respectively, only one differential signal is applied to the sense amplifier 48.

As shown in FIG. 3, one commonly used memory cell 110 has a pair of cross-coupled inverters, 112, 114, that act as a latch 116 to store a voltage representing a logical one or a logical zero. One end 118, 120 of the latch 116 outputs a logical one while the other end, 120, 118, respectively, outputs the complement, a logical zero. In the memory cell 110, the complementary signals output by the latch 116 are used as a differential signal on lines 118 and 120 to represent a logical one value or a logical zero.

A write port 121 is used to store data in the latch 116. First and second access transistors, NMOS transistors 122 and 124, respectively, connect to the latch 116. The write word line 126 connects to the gate of each access transistor 122, 124. To store data in the memory cell, a write word line signal is asserted on the write word line 126 and a differential data signal is input via the NMOS access transistors, 122 and 124, on the write bit lines 128 and 130, respectively.

To sense the data, a read word line signal is asserted on the read word line 132 which is connected to the gates of a pair of NMOS passgate transistors 134, 135. The NMOS passgate transistors 134, 135 form a read port 136. The read word line signal is asserted by applying a predetermined voltage, such as a logical one, to the read word line 132. In response to the assertion of the read word line signal, the end of the latch 116 storing a logical one (a high voltage level) will pull up the voltage of the associated line through one of the passgate transistors to the high voltage level (a logical one level). The end of the latch 116 storing a logical zero value (low voltage level) will pull down the voltage of the associated line through the other passgate transistor to the logical zero.

For example, if the latch 116 stores a logical one, when the read word line signal is asserted, read bit line 138 will be pulled up to a logical one, while read bit line 139 will be pulled down to a logical zero value. In contrast, if the latch 116 stores a logical zero value, when the read word line is asserted, read bit line 138 will be pulled down to a logical zero, while read bit line 139 will be pulled up to a logical one.

In memory circuits, capacitive effects reduce speed. One major capacitive effect is diffusion loading. NMOS and PMOS transistors have some amount of diffusion capacitance or diffusion loading. To form the source and drain of the transistors, the source and drain regions are doped with n+ and p+ ions, and these regions are referred to as diffusion regions. Diffusion regions have a diffusion capacitance between the diffusion region and the substrate. The amount of diffusion capacitance is related to the voltage between the diffusion regions and the substrate, as well as the effective area of the diffusion region and the depth of the diffusion region.

Referring back to FIG. 2, the diffusion loading of a particular bit line is related to the number of cells connected to that bit line. For example, bit line 0 (BL0) 72 connects to m cells. Therefore, if each cell has a diffusion capacitance of Cd, the total diffusion loading on the bit line 0 (BL0) 72 is Cd multiplied by m (m·Cd). The diffusion loading limits the speed at which the memory operates.

In the memory 20 of FIG. 2, a sense amplifier enable signal is used to control the sense amplifier 48. In this architecture, the sense amplifier 48 is turned on at a predetermined time to ensure that the sense amplifier 48 is not sensing too early. Thus the differential design needs a predetermined amount of overhead time to ensure that the bit line signals are not sensed too early. This also increases the complexity of the circuitry. This design complexity is typically accompanied by circuit fabrication complexity.

In view of the foregoing, it would be highly desirable to provide a memory circuit that operates at a faster speed with reduced diffusion loading of the bit lines. It would also be desirable to provide a memory circuit that does not use a sense amplifier enable signal. Such a circuit would operate at an increased speed, reduce timing problems and have a simpler design.

SUMMARY OF THE INVENTION

A memory has an array of memory cells arranged in rows and columns. In the columns, bit lines are connected to the memory cells in an alternating manner in which the memory cells in a column connect to different bit lines. Output circuitry that connects to the array of memory cells eliminates the need for a sense amplifier enable signal. In this way, by eliminating the need for the sense amplifier enable signal, the memory operates at an increased speed with fewer timing problems and has a simpler design. In addition, since the number of memory cells connected to each bit line is reduced, diffusion loading on the bit lines is reduced, thereby increasing memory speed.

In particular, in the array, the memory cells are arranged in rows and columns. A word line is coupled to each memory cell in each row. Bit lines are coupled to the memory cells in each column. Each bit line is coupled to a mutually exclusive subset of memory cells in the column, wherein the memory cells of a row, as selected memory cells, output a cell voltage on their coupled bit line when the word line is asserted. A multiplexor receives the cell voltage from the selected memory cells on the bit lines. The multiplexor is responsive to column select signals to select one column as a selected column, and output a multiplexor voltage corresponding to the cell voltage of the memory cell of the selected column.

In yet another embodiment, sense amplifiers are placed between the array of memory cells and the multiplexor. The sense amplifiers are coupled to the memory cells of the columns. Each mutually exclusive subset of memory cells is coupled to one of the sense amplifiers to receive the cell voltage output by the selected memory cells and to generate an amplified voltage. The multiplexor receives the amplified voltage instead of the cell voltage.

In this way, by placing a sense amplifier at the end of each bit line, the sense amplifier enable signal is eliminated and the complexity of the circuitry is reduced. In this approach the multiplexor selection is inherent to the design because only one bit line of multiple bit lines in a column is selected at a time.

In another alternate embodiment, single-ended memory cells are used. In this way, differential output from the memory cells is not required and the number of lines, and therefore circuit complexity, is reduced.

The alternating array of memory cells improves the speed of operation of the memory by reducing the diffusion loading on the bit lines by about at least one-half. In the multiplexor, each column select block receives one of the column select signals. Therefore, even though the columns have multiple bit lines, one column select signal still controls the output from a column.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE INVENTION

Figure 4:
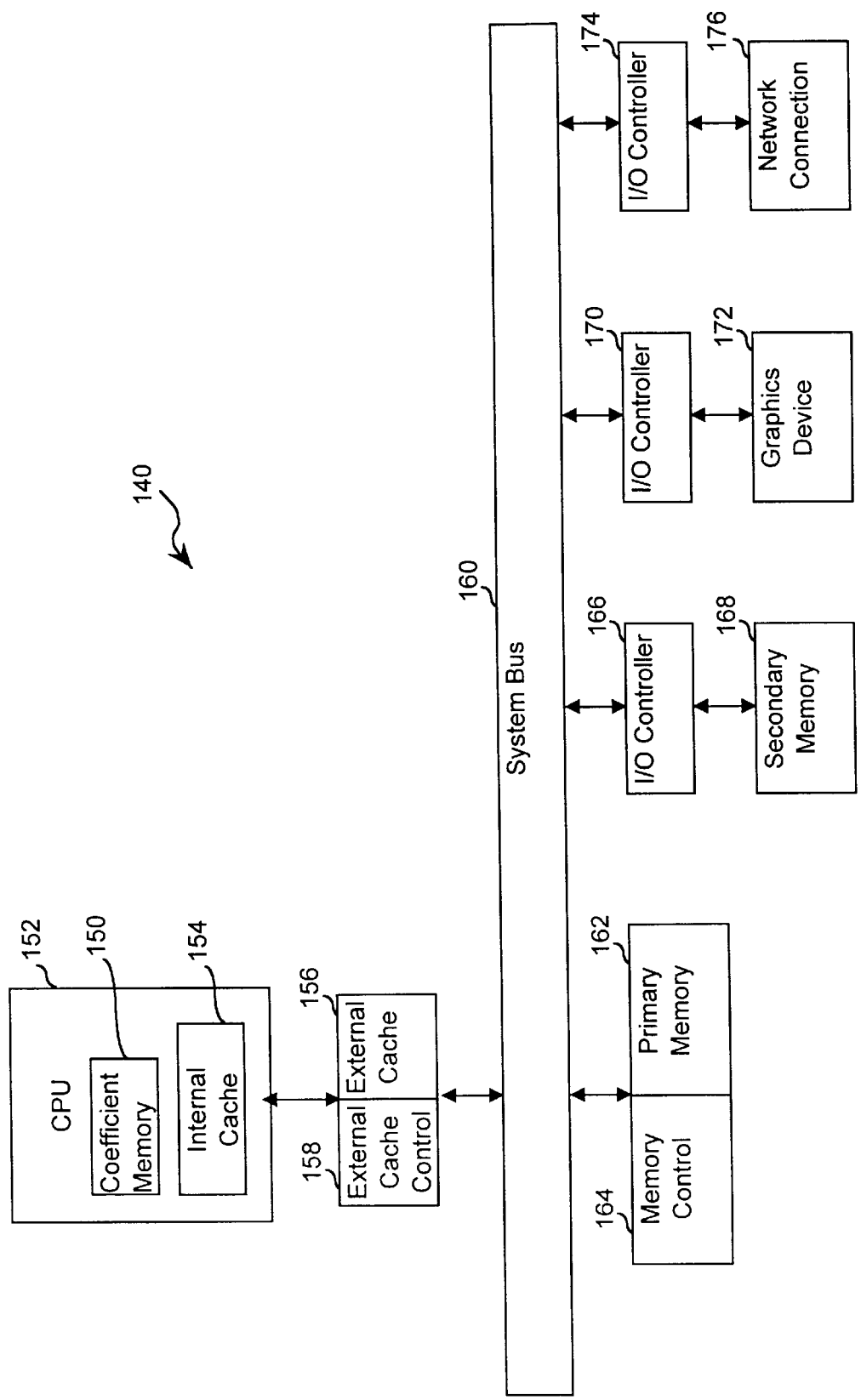
FIG. 4 illustrates a general purpose computer incorporating the memory of the present invention.

FIG. 4 illustrates a general purpose computer 140 incorporating the memory 150 of the invention in the central processing unit (CPU) 152. For example, memory 150 is a coefficient RAM. However, the memory of the present invention may be implemented in any number of the devices shown in FIG. 4. By way of example, the memory may be used in the internal cache 154 of the CPU 152.

As known in the art, the CPU 152 executes instructions of a computer program. Each instruction is located at a memory address. Similarly, the data associated with an instruction is located at a memory address. The CPU 152 accesses the specified memory address to fetch the instruction or data stored there.

Most CPUs 152 include an on-board memory called an internal cache 154. The internal cache 154 stores a set of memory addresses and the instructions or data associated with the memory addresses. The internal cache 154 can be implemented with the memory of the present invention.

If a specified address is not in the internal or L1 cache 154, the CPU 152 looks for the specified address in an external cache 156, also called an L2 cache. The external cache 156 may also be implemented with the memory of the present invention. The external cache 156 has an associated external cache controller 158.

If the address is not in the external cache 156 (a cache miss), the external cache controller 158 requests access to a system bus 160. When the system bus 160 becomes available, the external cache controller 158 is allowed to route its address request to the primary memory 162. The primary memory 162 has an associated memory controller 164. The memory controller 164 queries the primary memory 162 for the subject address. If the subject address exists in primary memory 162, the data output from the primary memory 162 is applied to the system bus 160. From the system bus 160, the data is stored in the external cache 156 and is passed to the CPU 152 for processing.

The foregoing processing is performed for every address request. If the address request is not found in the primary memory 162, similar processing is performed by an input/output controller 166 associated with the secondary memory 168.

As shown in FIG. 4, additional devices connect to the system bus 160. For example, FIG. 4 illustrates an input/output controller 170 operating as an interface between a graphics device 172 and the system bus 160. In addition, the figure illustrates an input/output controller 174 operating as an interface between a network connection circuit 176 and the system bus 160. The memory of the present invention may be used in any of the devices shown in FIG. 4.

Figure 5:
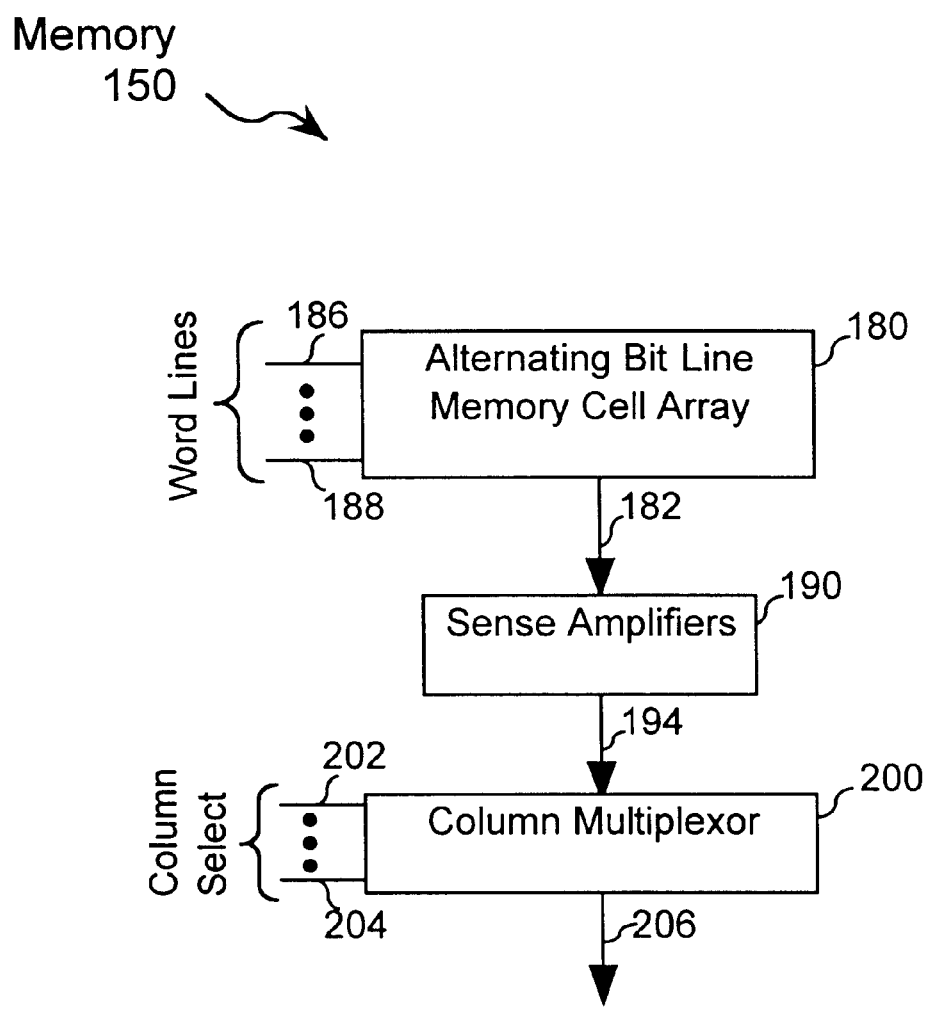
FIG. 5 illustrates a memory architecture of the present invention.

Referring to FIG. 5, the overall architecture of the memory 150 of the present invention is shown. An alternating bit line memory cell array 180 stores data and outputs the data on a set of bit lines 182 in response to address signals on word lines 186, 188. Sense amplifiers 190 receive the output of the alternating bit line memory cell array on the bit lines 182, amplify the received voltages, and output the amplified voltage signals on lines 194. A column multiplexor 200 receives the amplified voltage signals. The column multiplexor 200 responds to the column select signals 202, 204 and outputs the voltage corresponding to a memory cell in a selected row and column on line 206.

Figure 6:
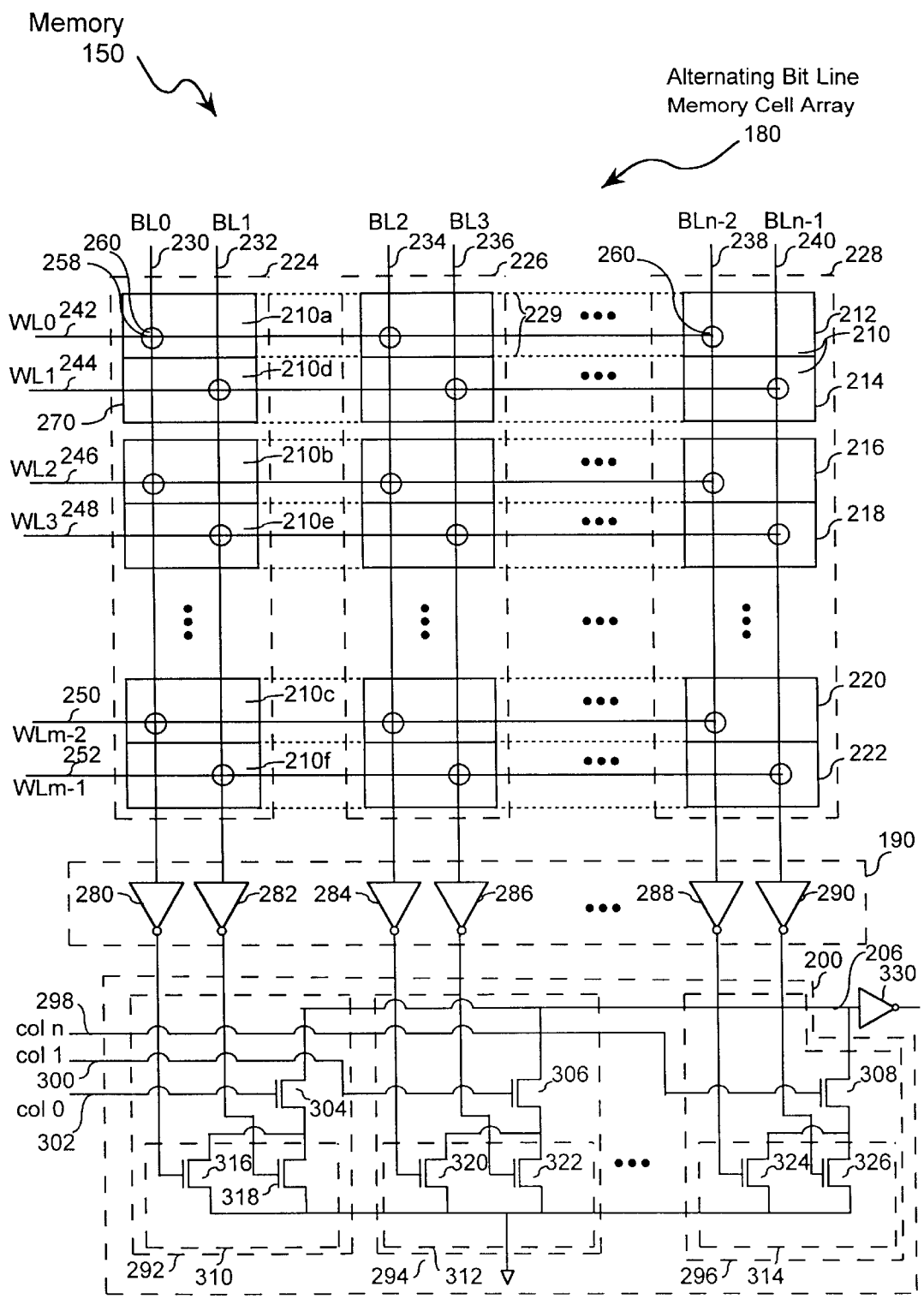
FIG. 6 illustrates a memory constructed in accordance with an embodiment of the invention shown in FIG. 5.

In FIG. 6, in a first embodiment, the alternating array 180 of memory cells 210 has m rows 212–222, and n columns, 224, 226 and 228. Dashed lines 229 between the cells indicate the memory cells in the row. In this description, particular memory cells include a character as a suffix, and will be referred to as 210a to 21of. Each cell 210 is connected to a bit line, BL0–BLn−1, 230–240, respectively, and a word line, WL0–WLm−1, 242–252, respectively. For example, word line 0 (WL0) 242, word line 1 (WL1) 255 and word line m−1 (WLm−1) 246 connect to the memory cells of rows 212, 214 and 222, respectively.

All cells 210 in a row 212–222 connect to the same word line, 242–252, respectively. For example, all cells in row 212 connect to word line 0 (WL0) 242. When the word line is enabled, the voltage signals stored in the cells connected to that word line are output on their respective bit line to the sense amplifiers 190.

The memory cells 210 in the array 180 output a single-ended signal. Therefore each bit line 230–240 is associated with one trace or line.

The columns 224–228 are associated with multiple bit lines. Each bit line 230–240 connects to a subset of the memory cells in a column 224–228. In this way, by providing multiple bit lines per column, the speed of operation of the memory is improved because the diffusion loading on the bit lines is reduced by about at least one-half.

In FIG. 6, the bit lines 230–240 and word lines 242–252 intersect at a point 258 in each memory cell. A circle 260 around the intersection of the bit line 230–240 and word line 242–252 indicates that the memory cell is connected to that bit line 230–240. The absence of a circle 260 around the intersection of the bit line 230–240 indicates that the bit line 230–240 is not connected to that memory cell. For example, in column 224, memory cells 210a, 210b and 210c connect to bit line 0 (BL0) 230, while memory cells 210d, 210e and 210f connect to bit line 1 (BL1) 232. Each bit line is associated with memory cells in one column.

Within each column 224–228, the memory cells associated with each bit line form a group or subset. In FIG. 6, memory cells 210a, 210b and 210c form a first group or subset, while memory cells 210d, 210e and 210f form a second group or subset. The subsets are mutually exclusive. In other words, a memory cell 210 belongs to only one group. Since a column has m memory cells and x bit lines, then each group will have m divided by x (m/x) memory cells.

The memory cells are arranged such that no cell is adjacent a memory cell from the same group. For example, since column 224 has two bit lines, 230 and 232, memory cells from each group are alternated with each other. In other words the memory cells in column 224 are arranged in the following order: 210a, 210d, 210b, 210e, . . . 210c and 210f.

Note that the present invention also has another type of subset or grouping which will be referred to as an ordered subset. Ordered subset 270 includes memory cells 210a and 210b. Each ordered subset includes only one memory cell from each group; and, the memory cells in the ordered subsets are adjacent each other. In FIG. 6, each ordered subset of memory cells is separated by a space between the memory cells. For example, memory cell 210d belongs to a different ordered subset from memory cell 210b; therefore, memory cells 210d and 210b are separated by a space. In practice, the memory cells may not be separated by a space.

Each ordered subset has a number of cells equal to the number of bit lines associated with the column. For example, in FIG. 6, each column is associated with two bit lines, therefore each ordered subset has two cells. The number of ordered subsets in a column is equal to the number of memory cells in a column, m, divided by the number of bit lines associated with that column, x.

Each ordered subset arranges the memory cells in the same order with respect to the bit lines. For example, as shown in FIG. 6, the cells connected to bit line 0 cells are "above" the cells connected to bit line 1.

In a noteworthy aspect of the invention, the sense amplifier enable signal is not required because each bit line is connected to a dedicated sense amplifier. In the set of sense amplifiers 190, each bit line 230–240 is connected to a sense amplifier 280–290, respectively. The sense amplifiers 280–290 receive the voltage output by the selected memory cells on the bit lines, amplify the cell voltages and output the amplified signals to the multiplexor 200. In this way, by eliminating the sense amplifier enable signal, the present invention reduces circuit complexity.

The multiplexor 200 has a set of column select blocks 292, 294, 296 connected in parallel that output a voltage corresponding to the selected memory cell. Each column 224–228 has a corresponding column select block 292–296, respectively. Each column select block 292–296 is responsive to a separate column select signal, col 0, col 1 and col n, on column select lines 298, 300 and 302. To select a memory cell from a particular column, 224, 226 and 228, one of the column select signals, col 0, col 1 and col n, has a logical high which is applied to the gate of the column select transistor 304, 306 and 308, respectively.

In the column select block 292, 294, 296, an amplifier receive block 310, 312, 314 receives the amplified signal from the sense amplifiers 280–290. Each amplifier receive block 310, 312, 314 includes a pair of receive transistors, 316–326, connected in parallel, that receive the amplified signal from the sense amplifiers 280–290, respectively. Each receive transistor 316–326 is an NMOS transistor.

The amplifier receive block 292–296 acts as a pull-down circuit. Line 206 is precharged to a logical one and will be discussed in detail with respect to FIG. 9. Since only one of the word lines 242–252 is asserted at a time and each word line 242–252 connects to only one memory cell in a column 224–228, only one of the transistors, 316, 318, 320, 322, 324, 326, in each amplifier receive block 292–296 will receive the amplified cell voltage. When any one of the amplified signals from the sense amplifiers 280–290 is a logical one, the corresponding receive transistor 316–326 will turn on and pull down the voltage at its drain to a logical zero. If the corresponding column select signal at the gate of the column select transistor 304–308 is a logical one, then the output on line 206 will be pulled down to a logical zero. The output of the multiplexor 200 is supplied to an output buffer 330 for further processing.

The overall operation of the present invention will now be described. In the present invention, only one word line 242–252 is active or asserted at a time, therefore, only one bit line 230–240 in each column 224–228 will be active or output a cell voltage at a time. When a selected memory cell stores a logical zero, that memory cell outputs the cell voltage corresponding to the logical zero value to the corresponding sense amplifiers. The sense amplifier 280–290 amplifies and inverts the signal to a predetermined voltage. The predetermined voltage is selected to be greater than or equal to the threshold voltage of the NMOS transistors 316–326 such that the NMOS transistors 316–326 will turn on. When the NMOS transistor 316–326 turns on, the output of the amplifier receive block is pulled-down to ground, a logical zero.

When a particular column is selected, such as column 224, the column select signal (col 0) on the gate of the column select transistor 304 will be at a logical one which is greater than or equal to the threshold voltage of the column select transistor 304 and the column select transistor 304 turns on. As described above, if the output of the amplifier receive block 310 is pulled down to ground and the column select transistor 304–308 is on, the multiplexor 200 outputs a logical zero, which corresponds to the logical zero stored in the selected memory cell.

If the selected memory cell stores a logical one, the output line 206 of the multiplexor 200 is not pulled down, remains at its precharge level, and continues to output a logical one.

Figure 1:
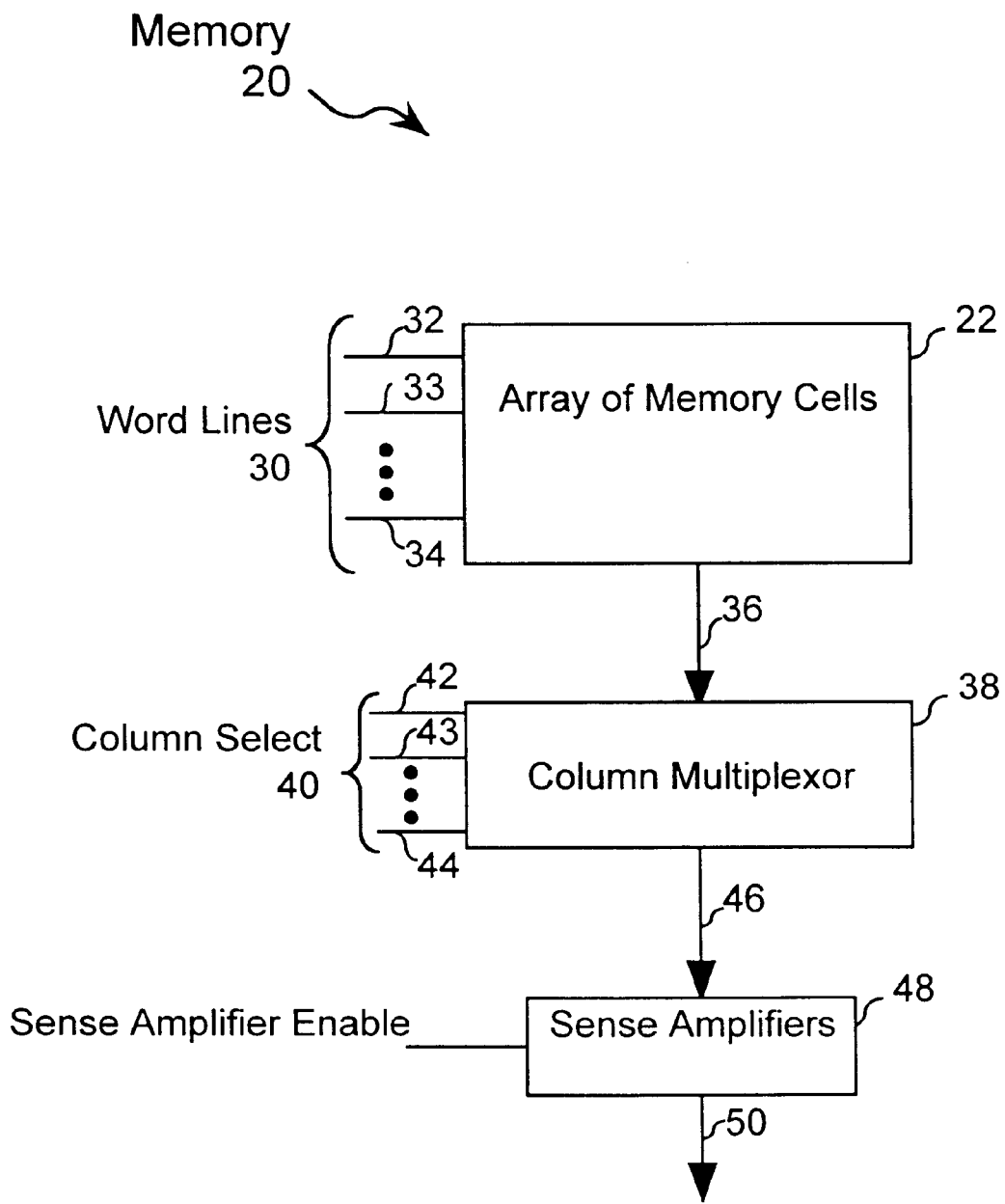
FIG. 1 illustrates a general architecture of a memory of the prior art.
Figure 2:
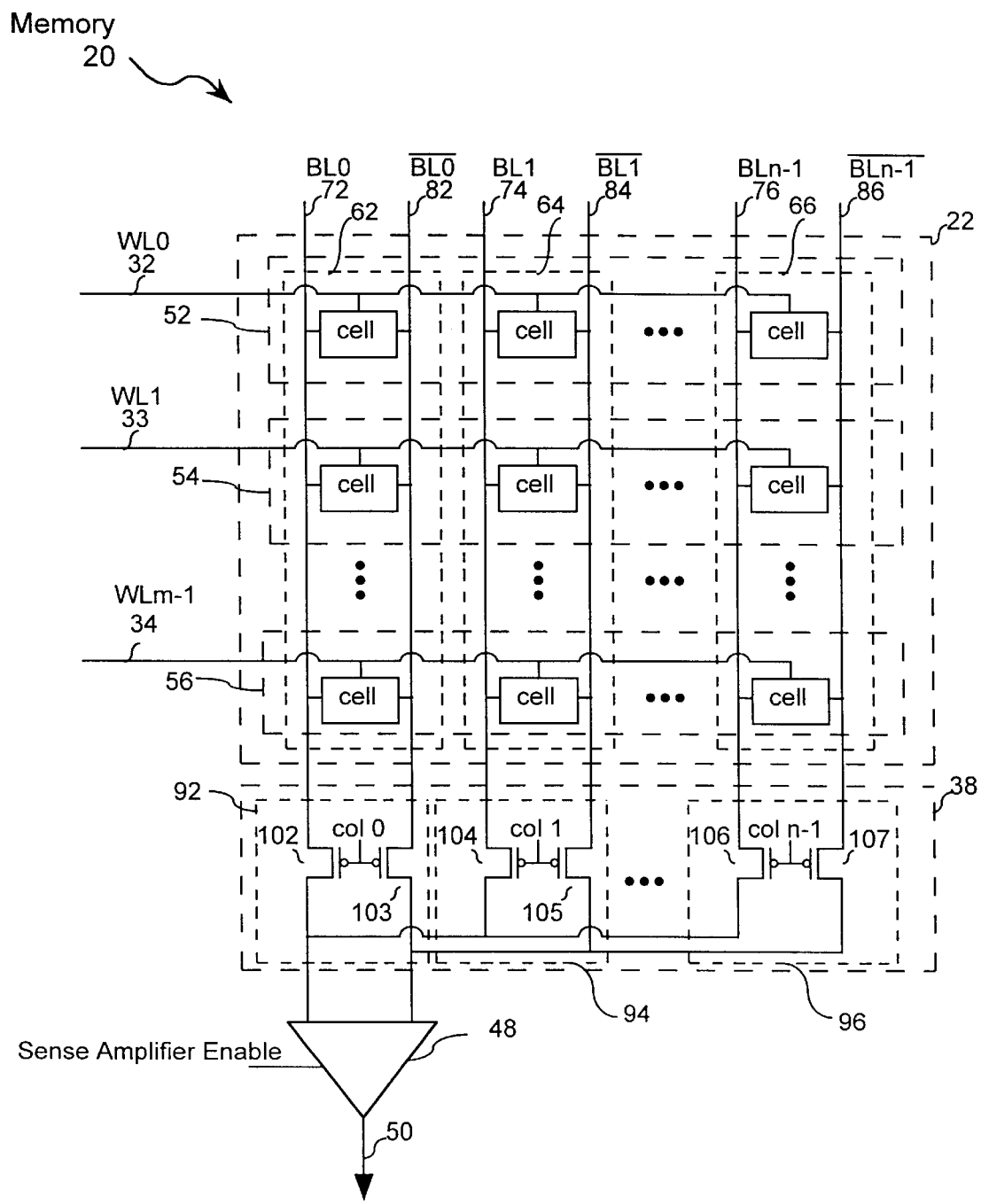
FIG. 2 illustrates a detailed memory architecture of the prior art that uses a differential approach.
Figure 3:
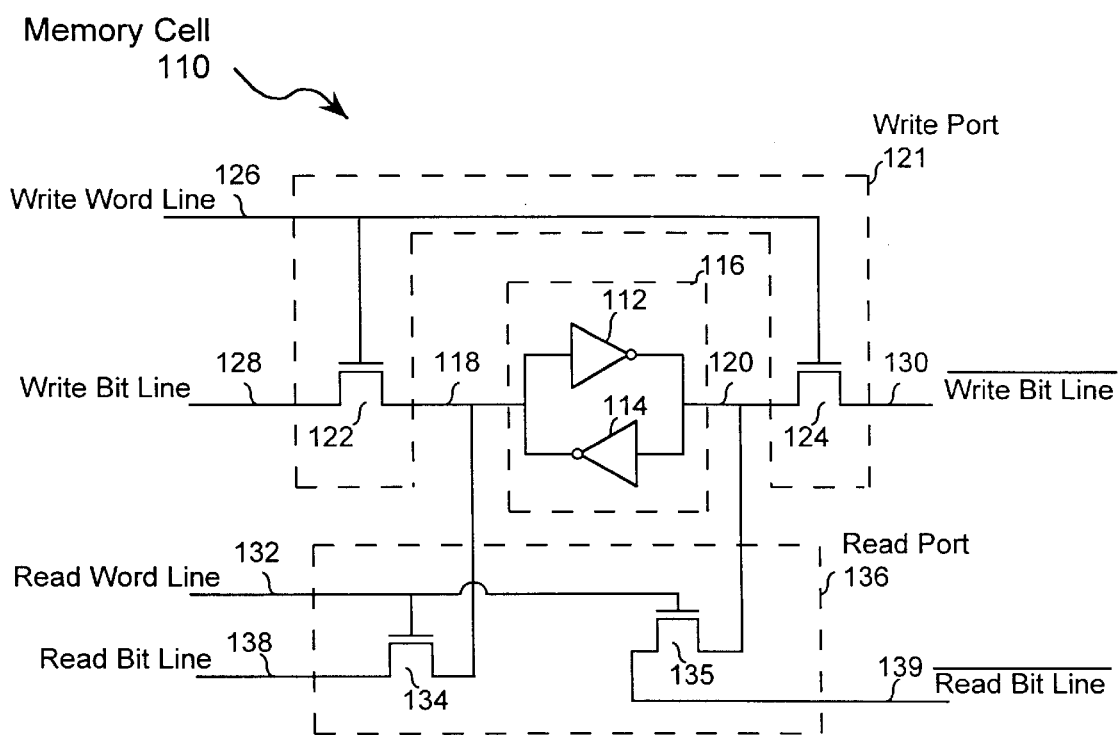
FIG. 3 illustrates a memory cell used in the memory architecture of FIG. 2.

In another noteworthy aspect of the invention, instead of connecting all the pass gate transistors 102–107 (FIG. 2) for all bit lines together, the present invention provides a column select block 292–296 for each column 224–228 and connects the outputs of the column select blocks 292–296 together. For example, in FIG. 6, two bit lines are input to column select block 292. When the column select signal is enabled, one of the two amplified bit line signals will be output.

In a more general embodiment, any number of bit lines X may be associated with each column. Thus each column would be associated with X sense amplifiers, and in the multiplexor, each amplifier receive block has X NMOS transistors.

A Single-Ended Memory Cell

Figure 7:
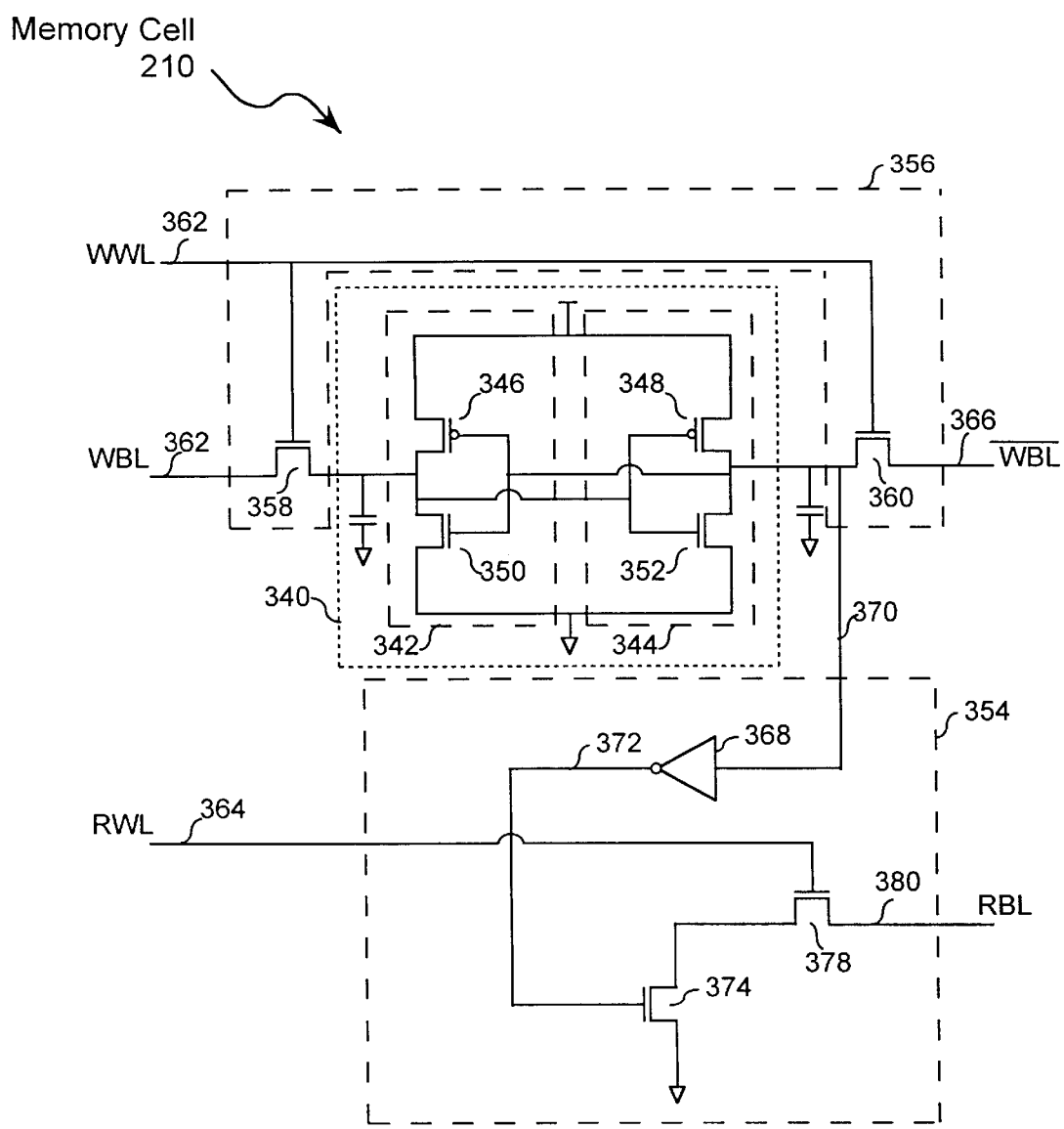
FIG. 7 illustrates a memory cell constructed in accordance with an embodiment of the invention shown in FIG. 6.

FIG. 7 is a circuit diagram of a single-ended memory cell 210 suitable for use with the present invention. A latch 340 stores the memory cell voltage in a pair of cross-coupled inverters 342, 344. The inverters 342, 344 are implemented with PMOS 346, 348 and NMOS transistors 350, 352 connected in series. The operation of the latch 340 is well-known and will not be described in detail.

The memory cell 210 has a separate read port 354 and write port 356. In the write port 356, when the write word line signal is asserted on the write word line (WWL) 362, NMOS transistors 358, 360 apply a logical one or zero to the latch 340 via the write bit line signals WBL and $\overline{\text{WBL}}$ on write bit lines 364, 366, respectively.

In the read port 354, an inverter 368 receives a read signal on line 370 at one end of the latch 340. The inverter 348 supplies a read signal on a read line 372. The read signal is applied to the gate of a read port transistor 374. A read word line (RWL) signal on line 376 controls a read access transistor 378 which outputs the cell voltage on the read bit line (RBL) 380. The read port transistor 374 and the read access transistor 378 are NMOS transistors.

If the latch 340 stores a logical zero, the inverter 368 applies a read signal having logical one value to the gate of the read port transistor 374. In response to the logical one, the read port transistor 374 turns on and pulls the source of the read access transistor 378 to ground, a logical zero. When the read word line signal is asserted on the read word line 364, the read access transistor 378 turns on and pulls down the read bit line to ground 380, a logical zero.

If the latch 340 stores a logical one, the inverter 368 applies a read signal having a logical zero value to the gate of the read port transistor 374, which does not turn on. When the read word line signal is asserted on the read word line 364, the read access transistor will turn on. Since the read port transistor 374 is off, the read bit line signal remains at a logical one.

A Sense Amplifier

Figure 8:
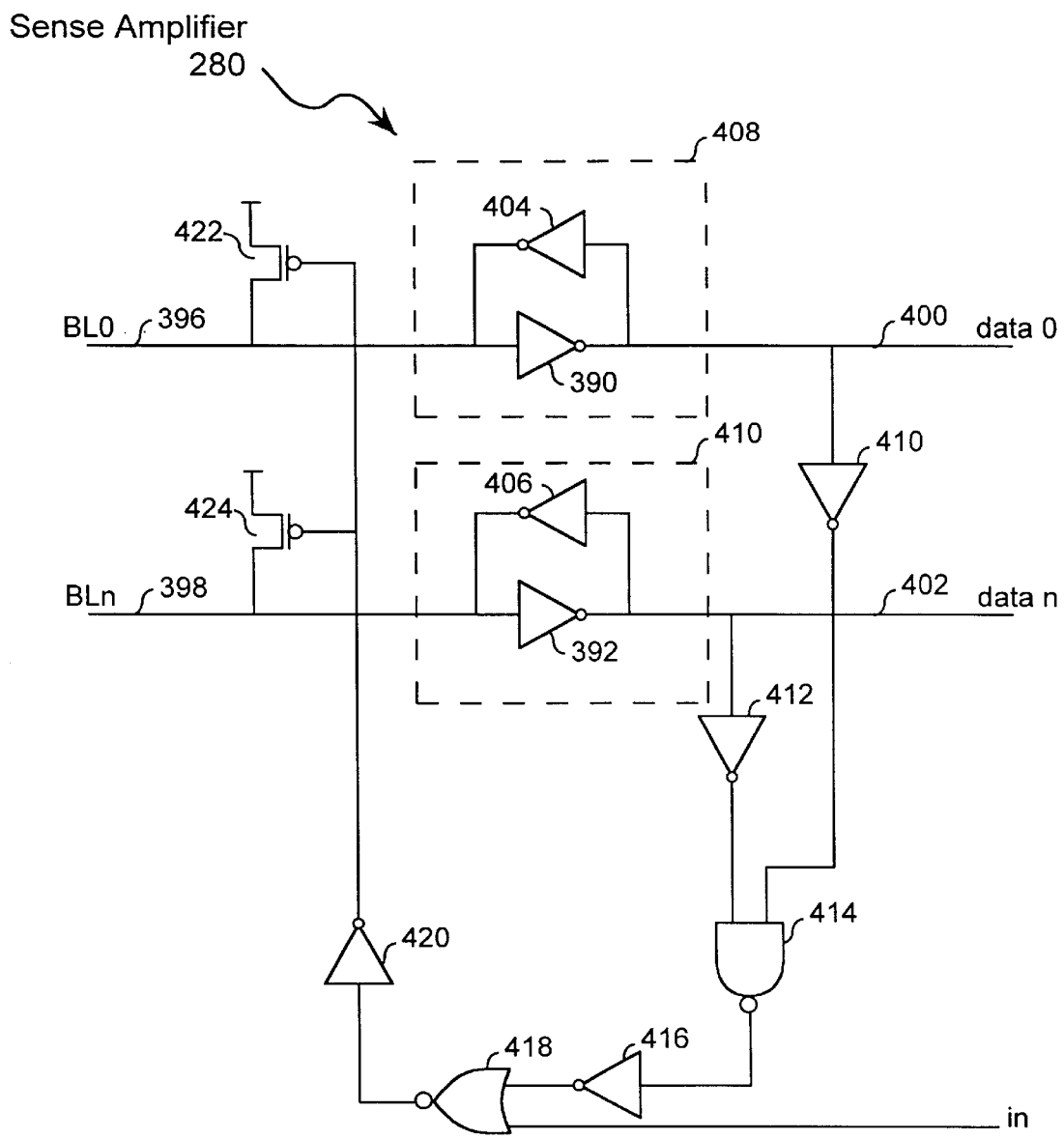
FIG. 8 illustrates a sense amplifier constructed in accordance with an embodiment of the invention shown in FIG. 6.

FIG. 8 is a circuit of a sense amplifier 280 suitable for use with the present invention. In one embodiment, all sense amplifiers 280–290 of FIG. 6 are implemented using the sense amplifier circuit shown in FIG. 8.

The sense amplifier 280 is a dynamic circuit that is active-low. Active-low means that the sense amplifier 280 outputs a pulse with a logical one value when the corresponding bit line is pulled-down to a logical zero.

In the sense amplifier 280, drive inverters 390, 392 are coupled to a dynamic precharge circuit. The dynamic precharge circuit includes all the components shown in FIG. 8, except for the drive inverters 390, 392. The drive inverters 390, 392 receive the bit line signal, BL0, BLn, from the bit line 396, 398 and output an inverted signal data, data 0, data, on lines 400, 402, respectively. When the bit line signal BL0, BLn, is a logical one, the drive inverter 390, 392 outputs a logical zero and the dynamic precharge circuit remains inactive.

When a bit line signal BL0, BLn is pulled-down to a logical zero, the dynamic precharge circuit becomes active. The drive inverters 390, 392 output logical ones. Another inverter 404, 406 is cross-coupled with the drive inverter 390, 392. The cross-coupled inverters act as a latch 408, 410 to maintain the output signal at a logical one. A first reset inverter 412 receives the logical one and outputs a logical zero to a NAND gate 414. The logical zero causes NAND gate 414 to output a logical one to a second reset inverter 416 which outputs a logical zero. A NOR gate 418 receives the logical zero from the second inverter 416 and an "in" signal. In this description, the "in" signal is a logical zero and remains inactive. In response to the logical zero from the second reset inverter 416, the NOR gate 418 outputs a logical one to a third reset inverter 420 which applies a logical zero to the gate of the pullup transistors 422, 424. The pullup transistors 422, 424 are PMOS transistors. In response to the logical zero, the pullup transistors 422, 424 become active and pull up the bit line 396, 398 to a logical one which causes the drive inverter 390, 392 to output a logical zero on lines 400, 402 and reset the latch 408, 410.

The Multiplexor

Figure 9:
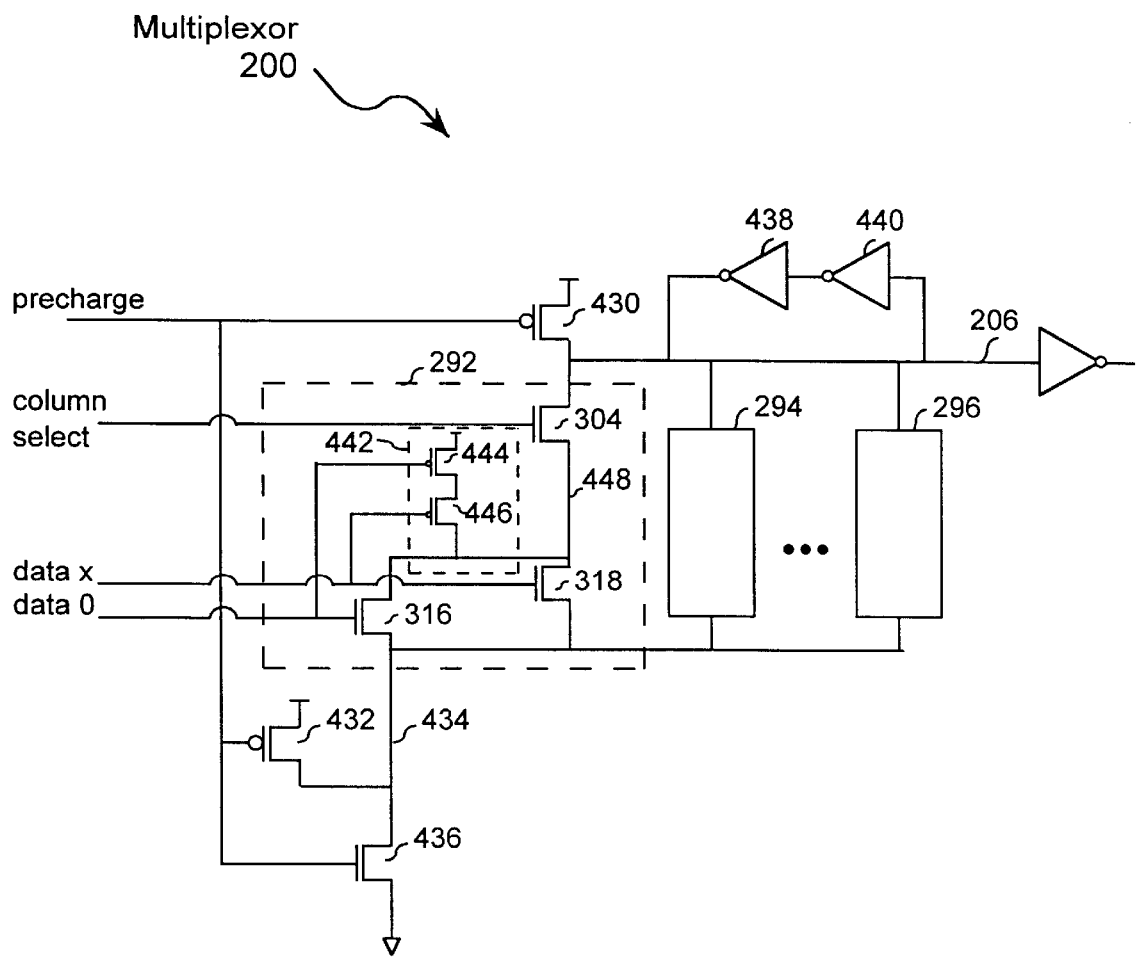
FIG. 9 illustrates a multiplexor constructed in accordance with an embodiment of the invention shown in FIG. 6.

In FIG. 9, the multiplexor 200 is shown with the output line conditioning circuitry. When a precharge signal having a logical zero value is applied to the gate of a PMOS precharge transistor 430, a logical one (Vdd) is applied to the output line 206, thereby precharging the output line 206.

Also in response to the logical zero level of the precharge signal, a PMOS transistor 432 turns on and pulls line 434 to a high voltage level. When the precharge signal is a logical one, NMOS transistor 436 turns on and pulls line 436 to ground, logical zero. Two inverters 438, 440, connected in series, help to maintain the output line 206 at a stable voltage, thus reducing the sensitivity of the circuit to noise.

A stabilizer circuit 442 prevents charge sharing between transistors 304, 316 and 318. In the stabilizer circuit 442, when data 0 and data x are a logical zero, the transistors 444, 446 pull line 448 to a high voltage level. In this way, when the precharge signal is a logical zero and line 434 is pulled up to a logical one, current is prevented from flowing between transistors 304, 316 and 318.

A Second Embodiment of the Alternating Bit Line Memory Cell Array

Figure 10:
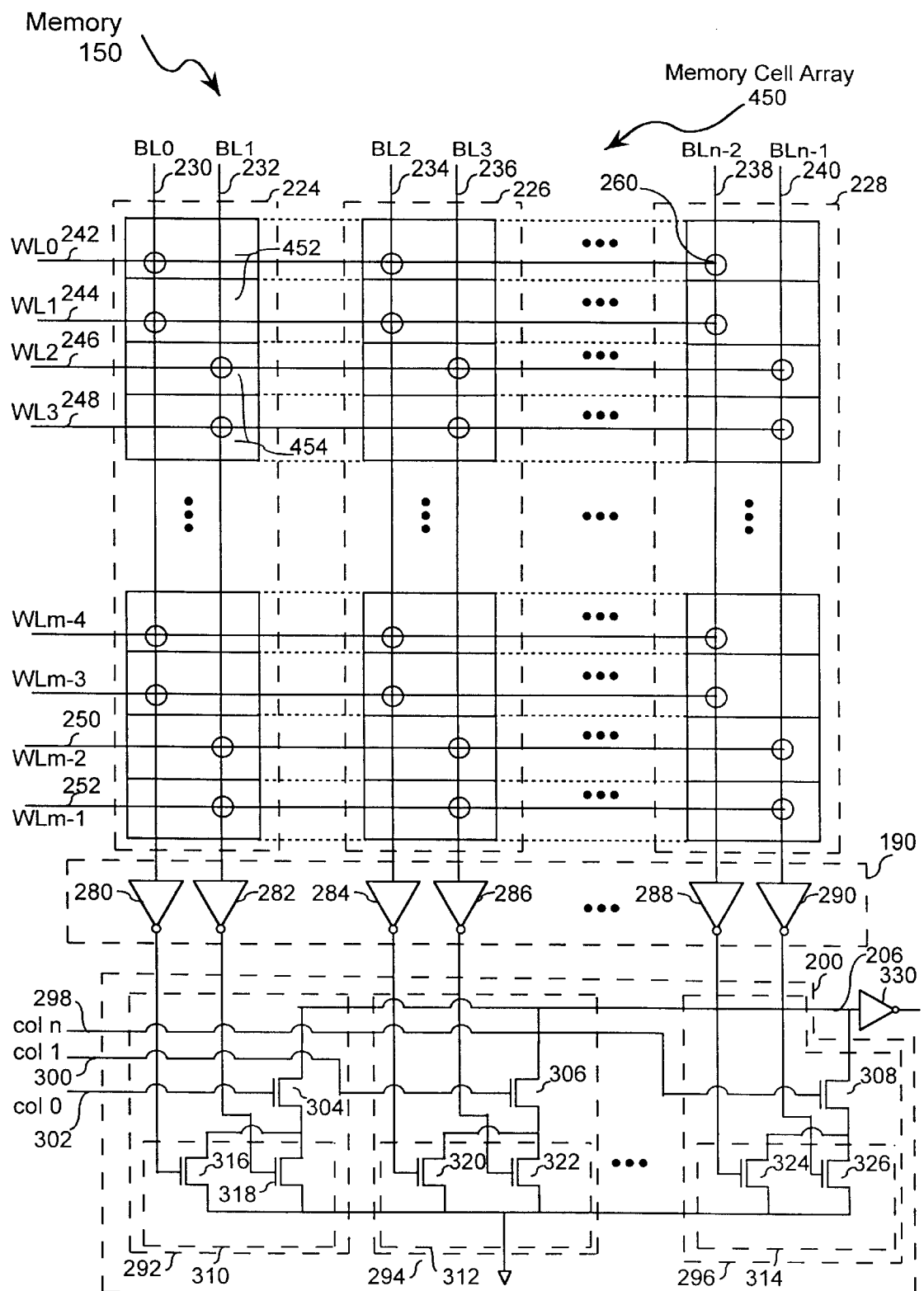
FIG. 10 illustrates a second embodiment of an alternating bit line memory cell array constructed in accordance with an embodiment of the invention shown in FIG. 5.

FIG. 10 corresponds to FIG. 6. The only difference is that, in the memory cell array 450 of FIG. 10, pairs 452, 454 of adjacent memory cells connect to the same bit line 230, 232, respectively. Therefore, the operation of the memory cell array 450 is the same as described with respect to FIG. 6. The memory cell array 450 has the advantage that, when implemented, pairs 452, 454 of adjacent memory cells physically share a diffusion region which connects to the bit line, and thereby efficiently utilizes the surface area of the chip. Even though adjacent pairs 452, 454 of memory cells connect to the same bit line 230, 232, respectively, diffusion loading of the bit line is still reduced by approximately at least one-half because two bit lines are used in a column.

A Third Embodiment of the Alternating Bit Line Memory Cell Array

Figure 11:
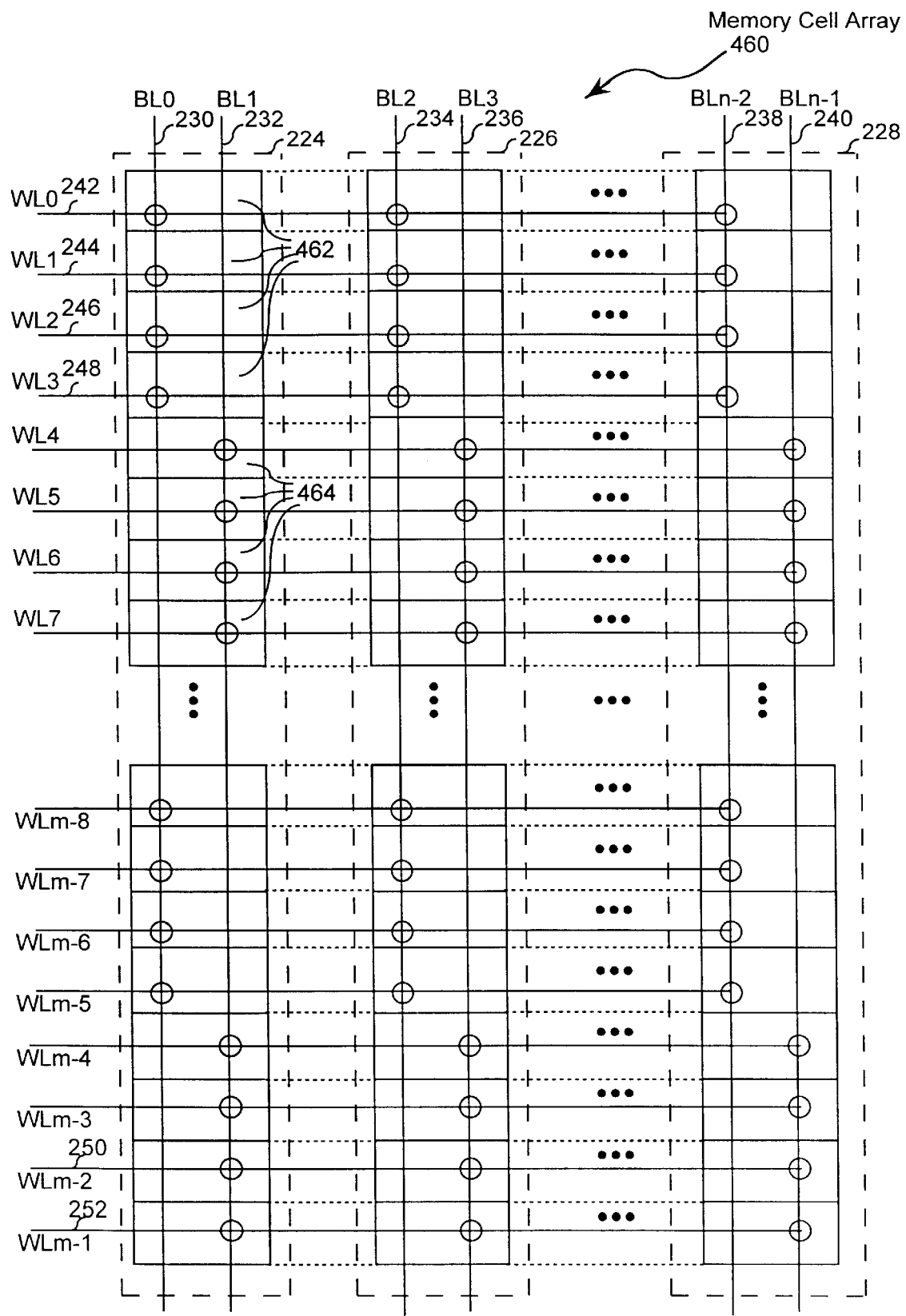
FIG. 11 illustrates a third embodiment of the alternating bit line memory cell array constructed in accordance with an embodiment of the invention shown in FIG. 5.

FIG. 11 corresponds to the memory cell array 180 of FIG. 6. The only difference is that, in the memory cell array 460 of FIG. 11, two pairs or a quad 462, 464 of adjacent memory cells connect to the same bit line. Therefore, the operation of the memory cell array 460 is the same as described with respect to FIG. 6. The memory cells may be formed in pairs as described above with respect to FIG. 10. Even though quads 462, 464 of memory cells connect to the same bit line, diffusion loading of the bit line is still reduced by approximately at least one-half because two bit lines are used in a column.

Additional embodiments of the present invention will now be described. In another embodiment, the memory includes the alternating array of memory cells without the sense amplifiers and the multiplexor.

In an alternate embodiment, the memory includes the alternating array of memory cells and the multiplexor, but does not include the sense amplifiers.

Although the memory of the present invention was described with respect to a random access memory, the memory architecture can also be used in read-only memories.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A memory, comprising:
   memory cells arranged in rows and columns;
   a plurality of word lines, each word line of said plurality of word lines being coupled to a row of said rows;
   a plurality of bit lines coupled to at least a subset of said memory cells, said subset of said memory cells of a selected row outputting cell voltages on said plurality of bit lines;
   a plurality of sense amplifiers coupled to said plurality of bit lines such that each bit line of said plurality of bit lines is coupled to one of said plurality of sense amplifiers, said plurality of sense amplifiers generating sensed voltages representative of said cell voltages, each of said plurality of sense amplifiers having:
      a first drive inverter coupled with a first one of said plurality of bit lines receiving a first signal on said first one of said plurality of bit lines;
      a second drive inverter coupled with a second one of said plurality of bit lines receiving a second signal on said second one of said plurality of bit lines; and
      a dynamic precharge circuit configured to reset said plurality of bit lines after generation of said sensed voltages coupled to said first drive inverter and said second drive inverter, said dynamic precharge circuit including:
         a third inverter coupled with said first inverter;
         a fourth inverter coupled with said second inverter;
         a NAND gate coupled to said third inverter and said fourth inverter, such that said third inverter and said fourth inverter provide inputs for the NAND gate;
         a fifth inverter coupled with said NAND gate;
         an input line;
         a NOR gate coupled with said fifth inverter and said input line such that said fifth inverter provides a first input to the NOR gate and said signal line provides a second input to the NOR gate;

a sixth inverter coupled with said NOR gate for inverting output from said NOR gate;

a first transistor coupled with said sixth inverter and said first one of said plurality of bit lines such that said inverted output from said NOR gate controls whether to change said first signal on said first one of said plurality of bit lines to a third signal; and a second transistor coupled with said sixth inverter and said second one of said plurality of bit lines such that said inverted output from said NOR gate controls whether to change said second signal on said second one of said plurality of bit lines to a fourth signal; and a multiplexor coupled to said subset of said plurality of sense amplifiers, said multiplexor configured to output a selected one of said sensed voltages.

2. The memory of claim 1 wherein said plurality of sense amplifiers each include a latch.

3. The memory of claim 2 wherein said latch includes a cross coupled set of inverters.

4. The memory of claim 2 wherein said latch is reset when said dynamic precharge circuit becomes inactive.

5. The memory of claim 1 wherein each of said sense amplifiers is always enabled.

6. A memory, comprising:

memory cells arranged in rows and columns, said memory cells of each row being coupled to a word line that is separate from word lines connecting to said memory cells of other rows, each column having mutually exclusive subsets of said memory cells, said memory cells of a selected row outputting respective cell voltages on coupled bit lines when said coupled word line is asserted;

a plurality of bit lines, each bit line being coupled to a selected subset of said mutually exclusive subsets of said memory cells;

a plurality of sense amplifiers coupled to said memory cells of said columns such that each bit line is connected to one of said plurality of sense amplifiers, said plurality of sense amplifiers receiving said respective cell voltages from said selected memory cells and generating sensed voltages, each of said plurality of sense amplifiers having:

a first drive inverter coupled with a first one of said plurality of bit lines receiving a first signal on said first one of said plurality of bit lines;

a second drive inverter coupled with a second one of said plurality of bit lines receiving a second signal on said second one of said plurality of bit lines; and a dynamic precharge circuit configured to reset said plurality of bit lines after generation of said sensed voltages coupled to said first drive inverter and said second drive inverter, said dynamic precharge circuit including:

a third inverter coupled with said first inverter, a fourth inverter coupled with said second inverter, a NAND gate coupled to said third inverter and said fourth inverter such that said third inverter and said fourth inverter provide inputs for the NAND gate, a fifth inverter coupled with said NAND gate, an input line, a NOR gate coupled with said fifth inverter and said input line such that said fifth inverter provides a first input to the NOR gate and said signal line provides a second input to the NOR gate, a sixth inverter coupled with said NOR gate for inverting output from said NOR gate, a first transistor coupled with said sixth inverter and said first one of said plurality of bit lines such that said inverted output from said NOR gate controls whether to change said first signal on said first one of said plurality of bit lines to a third signal, and a second transistor coupled with said sixth inverter and said second one of said plurality of bit lines such that said inverted output from said NOR gate controls whether to change said second signal on said second one of said plurality of bit lines to a fourth signal; and a multiplexor receiving said sensed voltages from said sense amplifiers, wherein said multiplexor, being respective to column select signals to select one of said columns as a selected column, is configured to output a multiplexor voltage corresponding to a cell voltage of a memory cell of said selected row and said selected column.

7. The memory of claim 6 wherein each sense amplifier of said sense amplifiers includes a latch.

8. The memory of claim 7 wherein said latch includes a cross coupled set of inverters.

9. The memory of claim 7 wherein said latch is reset when said dynamic precharge circuit becomes inactive.

10. The memory of claim 6 wherein each sense amplifier of said sense amplifiers is always enabled.

* * * * *